United States Patent [19]
Yamauchi et al.

[11] Patent Number: 5,063,425.
[45] Date of Patent: Nov. 5, 1991

[54] SEMICONDUCTOR MEMORY DEVICE WITH CAPACITOR OVER NON-VOLATILE MEMORY CELL GATE STRUCTURE

[75] Inventors: Yoshimitsu Yamauchi, Nara; Keizo Sakiyama, Kashihara, both of Japan

[73] Assignee: Sharp Kabushiki Kaisha, Osaka, Japan

[21] Appl. No.: 481,179

[22] Filed: Feb. 20, 1990

[30] Foreign Application Priority Data

Feb. 23, 1989 [JP] Japan .................................. 1-44143

[51] Int. Cl.[5] ...................... H01L 29/78; H01L 29/44
[52] U.S. Cl. .................................. 357/23.6; 357/23.5; 357/51; 357/71
[58] Field of Search .................. 357/23.6, 23.5, 51, 357/71

[56] References Cited

U.S. PATENT DOCUMENTS 4,419,743 12/1983 Taguchi ............................. 357/23.6
4,897,700 1/1990 Nakamura ......................... 357/23.6

OTHER PUBLICATIONS

Copy of "A Novel NVRAM Cell Technology for High Density Applications", published in Dec. of 1988, IEDM, San Fran., Calif., pp. 416-419.

*Primary Examiner*—Jerome Jackson, Jr.
*Attorney, Agent, or Firm*—Sandler, Greenblum & Bernstein

[57] ABSTRACT

An improved semiconductor memory device combining a volatile semiconductor storage with a nonvolatile semiconductor storage is disclosed. A capacitor for storing data in the volatile semiconductor storage is formed in a stack structure having a accumulation node polysilicon layer held in ohmic contact with the drain area of the nonvolatile semiconductor storage, an insulation film and a capacitor gate sequentially laminated one over the other on the nonvolatile semiconductor storage. The memory cell size can be minimized for high density applications thereof, with a longer data retention time achieved in the volatile semiconductor storage.

15 Claims, 2 Drawing Sheets

SEMICONDUCTOR MEMORY DEVICE WITH CAPACITOR OVER NON-VOLATILE MEMORY CELL GATE STRUCTURE

BACKGROUND OF THE INVENTION

1. Field of the Invention

The present invention relates to a semiconductor memory device which combines a volatile semiconductor storage with a nonvolatile semiconductor storage.

2. Description of the Prior Art

A conventional semiconductor memory device of the type referred to above is constructed in such a manner as shown in, for example, FIG. 3. Specifically, the semiconductor memory device of FIG. 3 has a nonvolatile semiconductor storage, a control unit and a volatile semiconductor storage formed on a P-type semiconductor substrate 21. The nonvolatile semiconductor storage is provided with a transistor M2 comprised of a drain area located at one end of an n-type impurity diffusion layer 22, a floating gate 25 and a control gate 27. A control unit is provided so as to switch the storing mode, and it includes a switching transistor M3 which has control gate 27 in common with transistor M2, and which is provided with an n-type source area 30. Further, the volatile semiconductor storage is provided with a word line selection transistor M1 which is comprised of an n-type drain area 29, a word line selection control gate 28 and a source area located at the other end of the above n-type impurity diffusion layer 22, and a capacitor C having a capacitor gate 35 formed at the central portion of the n-type impurity diffusion layer 22 via a SiO2 film 34. In the above construction, for switching the storing mode, a predetermined voltage is applied to control gate 27 or to capacitor gate 35, so that the data stored in capacitor C of the volatile semiconductor storage is transferred to transistor M2 of the nonvolatile semiconductor memory unit.

As is described hereinabove, however, capacitor C of the conventional semiconductor memory device is constructed in such a manner that capacitor gate electrode 35 is confrontingly provided on the surface at the central part of the n-type impurity diffusion layer 22. Therefore the n-type impurity diffusion layer 22 is consequently increased in size or area, causing an increase of the size of the memory cell.

SUMMARY OF THE INVENTION

Accordingly, an essential object of the present invention is to provide an improved semiconductor memory device having a reduced memory cell size.

In accomplishing the above object, according to the present invention, a semiconductor memory device is provided which comprises a semiconductor substrate; a volatile semiconductor storage; a nonvolatile semiconductor storage; a control unit for controlling the volatile and nonvolatile semiconductor storages so as to store data in either one of the volatile and nonvolatile semiconductor storage; and a capacitor provided in association with the nonvolatile semiconductor storage for storing data therein, the capacitor being formed in a stack structure such that a accumulation node polysilicon layer held in ohmic contact with a drain area of the nonvolatile semiconductor storage, an insulation film and a capacitor gate are sequentially laminated one over the other on the nonvolatile semiconductor storage.

As a result of this stack structure of the capacitor, in comparison with the prior art structure having the capacitor gate directly formed on the substrate, the memory cell can be reduced in size approximately by the area occupied by the capacitor gate.

BRIEF DESCRIPTION OF THE DRAWINGS

This and other objects and features of the present invention will become apparent from the following description taken in conjunction with one preferred embodiment thereof with reference to the accompanying drawings throughout which like parts are designated by like reference numerals and in which.

DESCRIPTION OF THE PREFERRED EMBODIMENT

Figure 1:
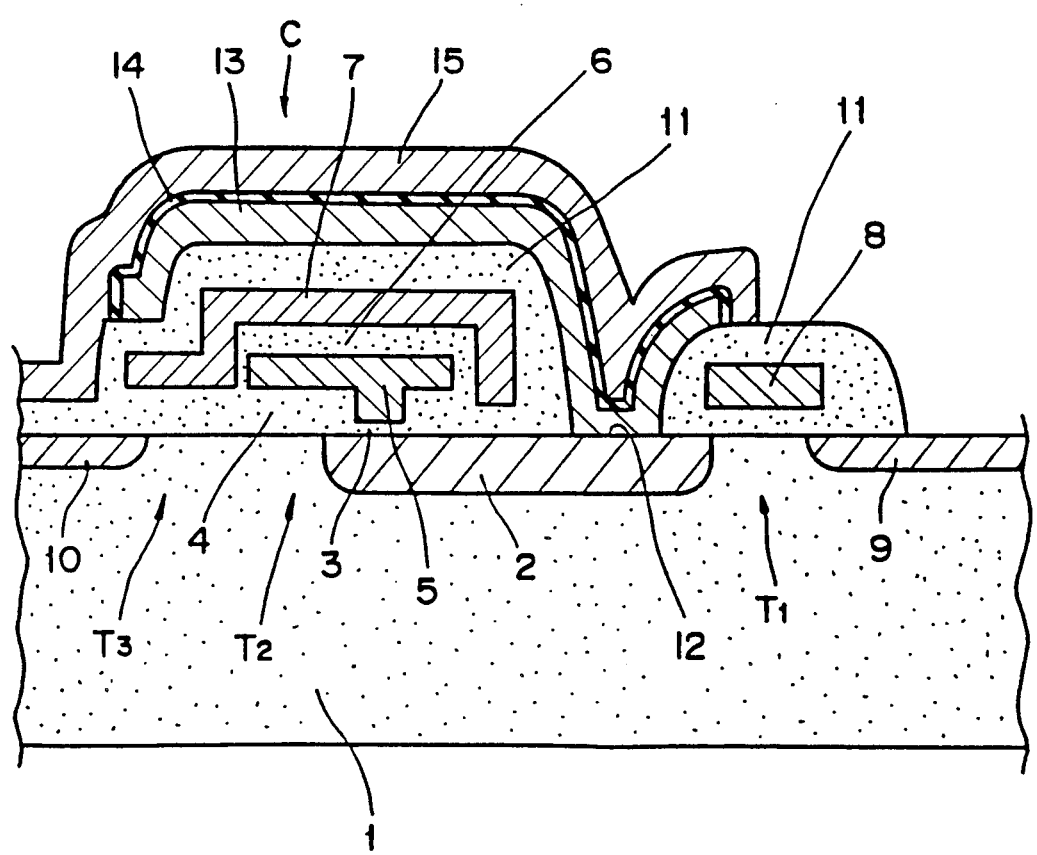
FIG. 1 is a schematic sectional view of a semiconductor memory device according to one preferred embodiment of the present invention.

Referring to FIG. 1, a semiconductor memory device according to the present invention is provided with a transistor T2 and a transistor T3 on a P-type silicon substrate 1. Transistor T2, provided for a nonvolatile semiconductor storage, includes a drain area located at one end of an n-type impurity diffusion layer 2, a floating gate 5 and a control gate 7. Transistor T3, which uses control gate 7 in common with transistor T2, functions as a control unit for switching the storing mode. Also, the semiconductor memory device of FIG. 1 includes a word line selection transistor T1, which is provided for a volatile semiconductor storage. Transistor T1 is comprised of an n-type drain area 9, a word line selection control gate 8 and a source area located at the other end of the n-type impurity diffusion layer 2.

Furthermore, a capacitor C is also provided in the volatile semiconductor storage, and is formed in a stack construction such that, a polysilicon layer 13, an insulation film 14 and a capacitor gate 15 are sequentially provided, one over the other, so as to entirely cover transistor T2. At a position between transistors T2 and T1, the polysilicon layer 13 is held in ohmic contact with the n-type impurity diffusion layer 2 through a contact window 12.

Figure 2:
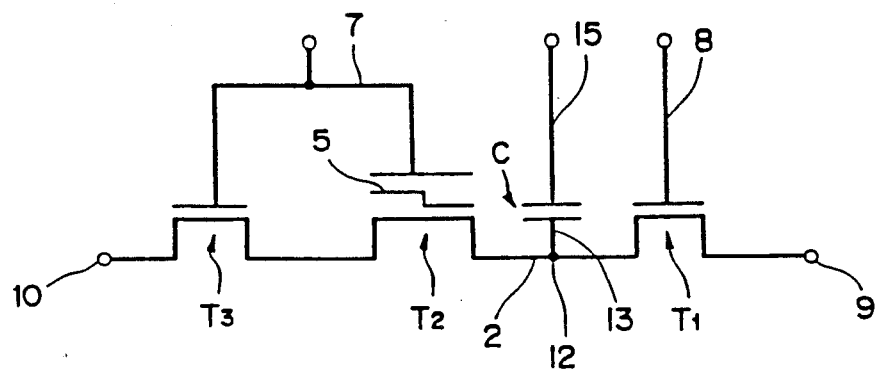
FIG. 2 is a diagram showing an equivalent circuit of the semiconductor memory device of FIG. 1.
Figure 3:
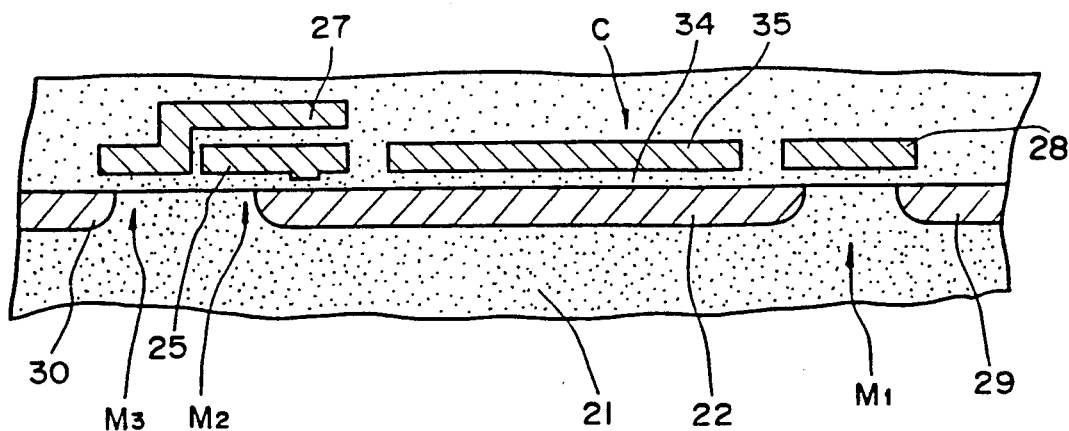
FIG. 3 is a schematic sectional view of a conventional semiconductor memory device.

An equivalent circuit of the semiconductor memory device is shown in a circuit diagram of FIG. 2.

The semiconductor memory device as described above is formed in the following process.

(1) As shown in FIG. 1, n-type impurity diffusion layer 2 is formed in P-type Si substrate 1, and then an SiO2 film 3 of approximately equal to or less than 100 Å and an SiO2 film 4 of approximately equal to 400 Å are formed in the vicinity of one end part of layer 2.

(2) Subsequently, floating gate 5 is so formed as to entirely cover the SiO2 film 3, a part of n-type impurity diffusion layer 2 and a part of P-type substrate 1. Over the floating gate 5, an insulation film 6 is formed which has a dielectric strength corresponding to that of an SiO2 film having a thickness of approximately 300 Å.

(3) Furthermore, a control gate 7 having a step portion, as shown in FIG. 1, is formed from a tungsten silicide film, which wholly covers floating gate 5, and at the same time, a word line selection gate 8 for transistor T1 is formed in the vicinity of the other end of n-type impurity diffusion layer 2.

(4) Then, an n-type drain area 9 and an n-type source area 10 are formed, such that an n-type impurity substance is ion-injected to the P-type Si substrate 1 by a self-alignment method using control gate 7 and word line selection gate 8 as a mask, and then a thermal dispersion is effected.

(5) After an insulation film 11 is formed over control gate 7 and word line selection gate 8, a contact window 12 is formed to partly uncover the surface of the n-type impurity diffusion layer 2. A polysilicon layer 13 is formed to cover contact window 12 and control gate 7, and is held in ohmic contact with n-type impurity diffusion layer 2 through the window 12.

(6) Thereafter, an insulation film 14 and a capacitor gate 15 are sequentially formed one over the other on polysilicon layer 13, thereby forming a capacitor C.

Since the semiconductor memory device formed in the above-described manner has a capacitor C formed by sequentially laminating polysilicon layer 13, insulation film 14 and capacitor gate 15 one over the other on the nonvolatile storage the on P-type Si substrate 1, the area of n-type impurity diffusion layer 2 can be reduced much more, as compared with the prior art structure in which the capacitor gate 35 is directly formed on the surface of the P-type Si substrate 1. Accordingly, the memory cell can be reduced in size to be suitable for high density applications. Furthermore, the amount of current leaking between the n-type impurity diffusion layer 2 and the P-type Si substrate 1 can be restricted because of the small area of n-type impurity diffusion layer 2, which contributes to a longer retention time of data of the volatile semiconductor storage.

As is made clear from the foregoing description, the capacitor of the semiconductor memory device according to the present invention is constructed in such a stack structure that an accumulation node polysilicon layer held in ohmic contact with the drain area of the nonvolatile semiconductor storage, an insulation film and a capacitor gate are sequentially laminated one over the other on the nonvolatile semiconductor storage, which is to be used for storing data in the volatile semiconductor storage. Accordingly, the memory cell can be reduced in size suitably for applications to high density devices. Moreover, the data retention time in the volatile semiconductor storage can be elongated.

What is claimed is:

1. A semiconductor memory device, comprising:
a semiconductor substrate;
means for providing a volatile semiconductor storage;
means for providing a nonvolatile semiconductor storage;
means for controlling said volatile and nonvolatile semiconductor storage means so as to store data in either one of said volatile and nonvolatile semiconductor storage means; and
a capacitor that is provided in association with said nonvolatile semiconductor storage means for storing data therein, said capacitor being formed in a stock structure such that a data storage node formed by a polysilicon layer is held in ohmic contact with a drain area of said nonvolatile semiconductor storage means, an insulation film and a capacitor electrode layer being sequentially laminated one over the other on said nonvolatile semiconductor storage means so that said capacitor is formed over a control gate and a floating gate of said nonvolatile semiconductor storage means.

2. A semiconductor memory device as claimed in claim 1, wherein said nonvolatile semiconductor storage means comprises a transistor having a drain area located a first end of an elongated n-type impurity diffusion layer formed in said substrate, said floating gate being provided over said first end of said elongated n-type impurity diffusion layer and said control gate being provided over said floating gate.

3. A semiconductor memory device as claimed in claim 1, wherein said volatile semiconductor storage means comprises a word line selection transistor having a source area located at an end of an n-type impurity diffusion layer, an n-type drain area formed in said substrate and a word line selection control gate provided over and bridging said source area and said drain area.

4. A semiconductor memory device as claimed in claim 1, wherein said means for controlling comprises a control unit having a control gate in common with said control gate of said nonvolatile semiconductor storage means.

5. The semiconductor memory of claim 1, wherein said capacitor is manufactured from said polysilicon layer, said insulation film and said capacitor electrode layer.

6. A semiconductor memory device, comprising:
a semiconductor substrate;
means for providing a volatile semiconductor storage;
means for providing a nonvolatile semiconductor storage that has a gate structure formed by a control gate that is provided over a floating gate;
means for controlling said volatile and nonvolatile semiconductor storage means so as to store data in either one of said volatile and nonvolatile semiconductor storage means; and
a capacitor that is provided in association with said nonvolatile semiconductor storage means for storing data therein, said capacitor being formed in a stock structure such that a data storage node is formed by a polysilicon layer that extends over said control gate and covers a step portion of said control gate.

7. The semiconductor memory device of claim 6, wherein said nonvolatile semiconductor storage means comprises a transistor that has a drain area located at a first end of an elongated n-type impurity diffusion layer formed in said substrate, a floating gate provided over said first end of said elongated n-type impurity diffusion layer and a control gate provided over said floating gate.

8. The semiconductor memory device of claim 7, wherein said floating gate is formed from polysilicon and said control gate is formed from a silicide that has a high melting point.

9. The semiconductor memory device of claim 8, wherein said silicide comprises tungsten silicide.

10. The semiconductor memory device of claim 6, wherein said capacitor is formed from said polysilicon layer, an insulation film and a capacitor electrode layer.

11. A semiconductor memory device, comprising:
a semiconductor substrate;
means for providing a volatile semiconductor storage that has a word line selection transistor that has a source area, a drain area formed in said semiconductor substrate and a word line selection control gate;
means for providing a nonvolatile semiconductor storage that has a control gate formed from a silicide having a high melting point that is positioned over a floating gate formed from a polysilicon layer, said control gate having a step portion on one side of said floating gate, a data storage node extending over said control gate and covering said step portion;

means for controlling said volatile and nonvolatile semiconductor storage means so as to store data in either one of said volatile and nonvolatile semiconductor storage means; and a capacitor formed from a polysilicon layer that is provided in association with said nonvolatile semiconductor storage means for storing data therein, said capacitor being formed in a stack structure such that a data storage node is formed by a polysilicon layer that extends over said control gate and covers said step portion of said control gate.

12. The semiconductor memory device of claim 11, wherein said word line selection control gate is provided over and bridges said source area and said drain area.

13. The semiconductor memory device of claim 11, wherein said drain area is formed in said semiconductor substrate.

14. The semiconductor memory device of claim 11, wherein said means for controlling comprises a control unit having a control gate in common with said control gate of said nonvolatile semiconductor storage means.

15. The semiconductor memory device of claim 11, wherein said silicide comprises tungsten silicide.

* * * * *